United States Patent
Chiang et al.

(10) Patent No.: US 11,790,145 B2
(45) Date of Patent: *Oct. 17, 2023

(54) METHOD FOR COLORING CIRCUIT LAYOUT AND SYSTEM FOR PERFORMING THE SAME

(71) Applicant: TAIWAN SEMICONDUCTOR MANUFACTURING COMPANY, LTD., Hsinchu (TW)

(72) Inventors: Chia-Ping Chiang, Taipei (TW); Ming-Hui Chih, Luzhou (TW); Chih-Wei Hsu, Zhubei (TW); Ping-Chieh Wu, Zhubei (TW); Ya-Ting Chang, Caotun Township (TW); Tsung-Yu Wang, Hsinchu (TW); Wen-Li Cheng, Taipei (TW); Hui En Yin, Taipei (TW); Wen-Chun Huang, Tainan (TW); Ru-Gun Liu, Zhubei (TW); Tsai-Sheng Gau, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/853,758

(22) Filed: Jun. 29, 2022

(65) Prior Publication Data

US 2022/0335192 A1 Oct. 20, 2022

Related U.S. Application Data

(60) Division of application No. 17/063,429, filed on Oct. 5, 2020, now Pat. No. 11,392,742, which is a
(Continued)

(51) Int. Cl.
*G06F 30/39* (2020.01)
*G03F 1/70* (2012.01)
(Continued)

(52) U.S. Cl.
CPC ............. *G06F 30/39* (2020.01); *G03F 1/70* (2013.01); *G03F 7/70466* (2013.01)

(58) Field of Classification Search
CPC ......... G06F 30/39; G03F 1/70; G03F 7/70466
(Continued)

(56) References Cited

U.S. PATENT DOCUMENTS 6,968,532 B2 11/2005 Sivakumar et al.
8,375,348 B1 * 2/2013 Raj .................... G06F 30/23
716/132
(Continued)

FOREIGN PATENT DOCUMENTS

WO 2015023856 A1 2/2015

OTHER PUBLICATIONS

Notice of Allowance issued in related U.S. Appl. No. 15/718,522, dated Aug. 12, 2019.
(Continued)

*Primary Examiner* — Suresh Memula
(74) *Attorney, Agent, or Firm* — McDermott Will & Emery LLP

(57) ABSTRACT

Implementations of the present disclosure provide coloring methods that sort and pre-color nodes of G0-linked networks in a multiple-patterning technology (MPT)-compliant layout design by coordinate. In one embodiment, a method includes identifying target networks in a circuit layout, each target network having two or more linked nodes representing circuit patterns, and each target network being presented in an imaginary X-Y coordinate plane, assigning a first feature to a first node in each target network, the first node is determined using a coordinate-based method, and assigning the first feature and a second feature to remaining nodes in
(Continued)

each target network in an alternating manner so that any two immediately adjacent linked nodes in each target network have different features.

20 Claims, 13 Drawing Sheets

Related U.S. Application Data continuation of application No. 16/660,506, filed on Oct. 22, 2019, now Pat. No. 10,796,055, which is a continuation of application No. 15/718,522, filed on Sep. 28, 2017, now Pat. No. 10,509,881.

(51) Int. Cl.
  *G03F 7/20* (2006.01)
  *G03F 7/00* (2006.01)
(58) Field of Classification Search
  USPC ............................................. 716/55
  See application file for complete search history.

(56) References Cited

U.S. PATENT DOCUMENTS

| | | | |
|---|---|---|---|
| 8,468,470 B2 | 6/2013 | Hsu et al. | |
| 8,473,874 B1 | 6/2013 | Sharma et al. | |
| 8,560,998 B1* | 10/2013 | Salowe | G06F 30/394 716/139 |
| 8,661,371 B1* | 2/2014 | Wang | G06F 30/39 716/52 |
| 8,671,368 B1* | 3/2014 | Salowe | G06F 30/394 716/54 |
| 8,719,737 B1* | 5/2014 | Wang | G06F 30/398 716/54 |
| 8,782,570 B1* | 7/2014 | Li | G06F 30/00 716/51 |
| 8,782,586 B2* | 7/2014 | Sezginer | H01L 23/528 716/54 |
| 8,935,639 B1* | 1/2015 | Tzeng | G06F 30/394 430/30 |
| 8,949,747 B1* | 2/2015 | Wang | G03F 7/70466 716/54 |
| 8,977,991 B2 | 3/2015 | Chen et al. | |
| 9,026,971 B1* | 5/2015 | Ho | G03F 7/70466 716/112 |
| 9,158,885 B1* | 10/2015 | Gray | G03F 7/70433 |
| 9,165,104 B1* | 10/2015 | Wang | G03F 1/70 |
| 9,268,897 B2* | 2/2016 | Yuan | G06F 30/394 |
| 9,779,198 B2* | 10/2017 | Kang | G03F 1/36 |
| 10,175,571 B2* | 1/2019 | Chen | G06F 30/39 |
| 10,670,973 B2* | 6/2020 | Zou | G03F 7/70433 |
| 10,817,635 B2 | 10/2020 | Hsieh et al. | |
| 11,036,126 B2 | 6/2021 | Lin et al. | |
| 2011/0003254 A1 | 1/2011 | Chang et al. | |
| 2011/0119648 A1* | 5/2011 | Chen | G06F 30/394 716/126 |
| 2011/0296360 A1 | 12/2011 | Wang et al. | |
| 2012/0196230 A1* | 8/2012 | Cho | G03F 7/70475 716/55 |
| 2013/0061186 A1* | 3/2013 | Hsu | G06F 30/00 716/55 |
| 2013/0074018 A1* | 3/2013 | Hsu | G03F 1/70 716/55 |
| 2013/0074028 A1* | 3/2013 | Blatchford | G06F 30/394 716/122 |
| 2013/0086543 A1* | 4/2013 | Agarwal | G06F 30/392 716/119 |
| 2013/0132913 A1 | 5/2013 | Fu et al. | |
| 2013/0205266 A1* | 8/2013 | Chen | G06F 30/394 716/55 |
| 2013/0263065 A1* | 10/2013 | Chen | G06F 30/00 716/55 |
| 2014/0244215 A1 | 8/2014 | Nakayama et al. | |
| 2015/0040082 A1* | 2/2015 | Huang | G03F 1/70 716/55 |
| 2015/0095857 A1 | 4/2015 | Hsu et al. | |
| 2015/0095865 A1* | 4/2015 | Bhattacharya | G03F 7/70433 716/112 |
| 2015/0100935 A1* | 4/2015 | Lin | G06F 30/398 716/111 |
| 2015/0121317 A1* | 4/2015 | Lee | G03F 7/70466 716/52 |
| 2015/0302129 A1* | 10/2015 | Chen | G06F 30/392 716/55 |
| 2015/0363541 A1* | 12/2015 | Lin | G06F 30/398 716/52 |
| 2016/0026748 A1* | 1/2016 | Hassan | G03F 1/36 716/52 |
| 2016/0292345 A1 | 10/2016 | Pikus et al. | |
| 2017/0255740 A1* | 9/2017 | Hsu | G06F 30/398 |
| 2017/0323046 A1* | 11/2017 | Hsu | G06F 30/398 |
| 2018/0068046 A1 | 3/2018 | Lin et al. | |
| 2018/0164695 A1 | 6/2018 | Hsieh et al. | |
| 2021/0019464 A1* | 1/2021 | Chiang | G03F 1/70 |

OTHER PUBLICATIONS

Non-final Office Action issued in related U.S. Appl. No. 15/718,522, dated Jan. 11, 2019.

Kahng et al., Layout Decomposition for Double Patterning Lithography, Nov. 2008, ACM, pp. 1-8 (2008).

Notice of Allowance issued in related U.S. Appl. No. 16/660,506, dated Jun. 5, 2020.

Notice of Allowance issued in related U.S. Appl. No. 17/063,429, dated Mar. 31, 2022.

\* cited by examiner

METHOD FOR COLORING CIRCUIT LAYOUT AND SYSTEM FOR PERFORMING THE SAME

CROSS-REFERENCE TO RELATED APPLICATIONS

This application is a divisional of U.S. patent application Ser. No. 17/063,429 filed Oct. 5, 2020, now U.S. Pat. No. 11,392,742, which is a continuation of U.S. patent application Ser. No. 16/660,506 filed Oct. 22, 2019, now U.S. Pat. No. 10,796,055, which is a continuation application of U.S. patent application Ser. No. 15/718,522 filed Sep. 28, 2017, now U.S. Pat. No. 10,509,881, the entire disclosure of each of which is incorporated herein by reference.

BACKGROUND

Integrated chips are made by a process that includes a design step and a subsequent fabrication step. During the design step, a layout of an integrated chip (IC) is generated as an electronic file. The layout includes geometric shapes corresponding to structures to be fabricated on-chip. During the fabrication step, the layout is formed onto a semiconductor workpiece.

The resolution that a conventional lithography tool can achieve is limited to 45 nanometer (nm) half pitch. To continue to use existing lithography tools to resolve smaller spaces, double patterning methods have been developed. Double patterning method involves splitting (e.g., dividing or separating) a target circuit pattern into two separate patterns. The two separate patterns are then formed separately on a single layer of a substrate using two separate masks in succession. By breaking a layout into multiple different masks, a minimum line spacing in the combined pattern is reduced while maintaining good resolution.

To use double patterning methods, a target circuit pattern must be double-patterning compliant, which means the target circuit pattern is capable of being decomposed into two separate patterns that each may be formed in a single layer of photoresist using the conventional lithography tool. For ease of visualization, patterns assigned to the same or different masks for exposing the same layer are often drawn in different colors. It has been observed that this color-assigning procedure can be problematic. For example, during the decomposition process of a circuit pattern, a first mask for forming a first decomposed pattern may be randomly represented as a first color (e.g., black color) in an electronic design automation (EDA) layout tool, and a second mask for forming a second decomposed pattern may be represented as a second, different color (e.g., gray color) in the circuit design tool. However, in the next decomposition process of the same circuit pattern, a first mask for forming the first decomposed pattern may be randomly represented as a second color (e.g., gray color) in the circuit design tool while a second mask for forming the second decomposed pattern may be represented as a first color (e.g., black color) in the EDA layout tool. In other words, the EDA layout tool may generate different coloring results (i.e., different photomask assignments) from time to time even though the same circuit pattern is analyzed.

Coloring results may differ from chip to chip due to design change or different database hierarchy adapted by different clients/chip designers. Coloring results may also differ from location to location within the same chip for the same reasons. Inconsistencies in coloring results can cause uncertainties in the manufacture of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
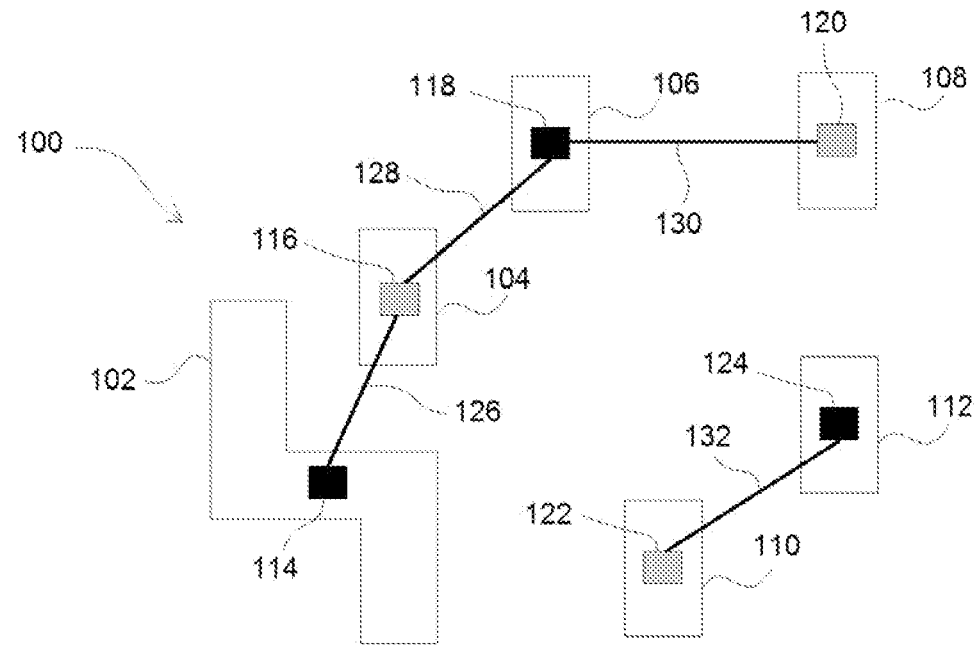
FIGS. 1A-1D depict four different coloring results in a portion of a layout having six circuit patterns after color assignment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure provides novel coloring methods for regulating DPT (Double-Patterning Technology)-compliant layout in electronic design automation (EDA) layout tools so that all or target G0-linked networks, after decomposition process, are sorted and designated with colors that follow a pre-determined coloring method. The coloring results of G0-linked networks are consistent from chip to chip or location to location within the same chip. The unique coloring results associated with G0-linked networks can be stored in the system and used as a fingerprint for identifying and assigning photomasks for identical or recurring G0-linked networks. It should be understood that various examples relating to DPT are discussed in this disclosure for ease of explaining the concepts. The methods and concepts of this disclosure can be applied to triple-patterning technology (TPT) or multiple-patterning technology (MPT) having greater number of photomasks.

A DPT mask assignment method generally includes: (1) identifying whether a layout has a native DPT conflict that prevents decomposition of the layout into the pre-determined number of photomasks to be used; (2) modifying the layout, if necessary, to eliminate the DPT conflicts; and (3) assigning the circuit patterns in the layout to the predetermined number of photomasks. As described below, step (1) can be achieved systematically for DPT using two or more photomasks to pattern a single layer.

FIG. 1A shows a portion of a layout 100 having six circuit patterns 102, 104, 106, 108, 110, and 112. The initial layout may be generated by a place and route tool. The layout can be in computer aided design format (e.g., GDSII), chip design, or retrieved from a design database. In some implementations, the layout includes all of the circuit patterns on a layer of an IC. In other implementations, the layout includes a subset of the circuit patterns within a region of the layer of the IC. Circuit patterns can be interconnect (line layer) patterns in a back end of line (BEOL) interconnect layer, or active device (front end of line) layer patterns. For example, circuit patterns may be any features such as "lines," "blocks," "vias," "openings," "holes," "channels," "recesses," "plugs," etc., that are suitable for providing a contact path which may extend horizontally and/or vertically within a structure.

A graph representing the circuit patterns is shown overlaid on the layout. The graph includes four nodes 114, 116, 118, 120, 122, and 124 representing the circuit patterns 102, 104, 106, 108, 110, and 112, respectively. Although reference is made to nodes below, it is understood that the nodes are lumped representations of the circuit patterns. The nodes are convenient for diagramming and for the purpose of analyzing and assigning the circuit patterns to various photomasks using EDA layout tools. Therefore, the nodes can be in any form of polygons.

For a given IC technology (e.g., 65 nm, 45 nm, 28 nm, or the like), a respective minimum separation distance (abbreviated as G0) is defined, such that two patterns closer to each other than the G0 distance cannot be patterned with good resolution using a single photomask and exposure. Any two nodes which are separated by a distance less than the minimum separation distance is indicated by a link (referred to herein as "G0-space"), meaning patterns associated with these nodes are too close to be in the same photomask. In the graph of FIG. 1A, the distances between nodes 114 and 116, nodes 116 and 118, nodes 118 and 120, and nodes 122 and 124 are less than the minimum separation distance and therefore are indicated by a link 126, 128, 130, and 132, respectively. FIG. 1A shows the nodes 114, 116, 118 and 120 are linked together to form a network, which is referred to herein as "G0-linked network 1". Likewise, nodes 122 and 124 are linked together to form another network, which is referred to herein as "G0-linked network 2".

Suitable software, such as a design rule checker (DRC) software, may be used to systematically check a layout design and show all G0-linked networks or G0-spaces in the layout design. An EDA layout tool or any suitable automated tool then uses this information to pre-color one or more nodes in the layout design, so that the patterns associated with pre-colored nodes are formed by the same photomask. For example, in the layout 100 of FIG. 1A, nodes 114 and 124 may be pre-colored to a first color (e.g., color black) that corresponds to a first photomask. After pre-coloring, a decomposition algorithm will assign colors to nodes 116, 118, 120, and 122 in an alternating manner so that any two immediately adjacent linked nodes are assigned with different colors. That is, node 118 will be assigned with the first color (color black) while nodes 116, 120, and 122 are assigned with a second color (e.g., color gray) that corresponds to a second photomask. With this set of assignments, the patterns formed during each of exposure steps can be patterned clearly. If a circuit pattern in a layout can be decomposed and assigned to two different photomasks so that within each of the photomasks, no pair of adjacent patterns are closer to each other than the minimum separation distance, then the layout is double-patterning technology (DPT) compliant. Similarly, if a circuit pattern in a layout can be decomposed and assigned to N different photomasks (N>2) so such a way that with each of the photomasks, no pair of adjacent patterns are closer to each other than the minimum separation distance, then the layout is multi-patterning technology (MPT) compliant.

It has been observed that while most circuit patterns in a DPT-compliant layout may be separated into two photomasks, the EDA layout tool may assign different colors to the same nodes from time to time at pre-coloring stage, resulting in various coloring combinations after decomposition of the circuit patterns. For example, for the layout 100 of FIG. 1A, the EDA layout tool may assign nodes 114 and 124 with a first color (e.g., color black), nodes 114 and 124 with a second color (e.g., color gray), nodes 114 and 122 with a first color (e.g., color black), or nodes 114 and 122 with a second color (e.g., color gray). A decomposition algorithm will then assign colors to nodes between the pre-colored nodes in an alternating manner, resulting in a total of four different coloring results (or so-called solutions) as shown in FIGS. 1A-1D. As discussed previously, coloring results may differ from chip to chip due to design change or different database hierarchy adapted by different clients/chip designers. Coloring results may also differ from location to location within the same chip for the same reasons. In other words, the EDA layout tool may generate four different coloring results (i.e., solutions) even though the very same G0-linked networks are analyzed.

Figure 1B:
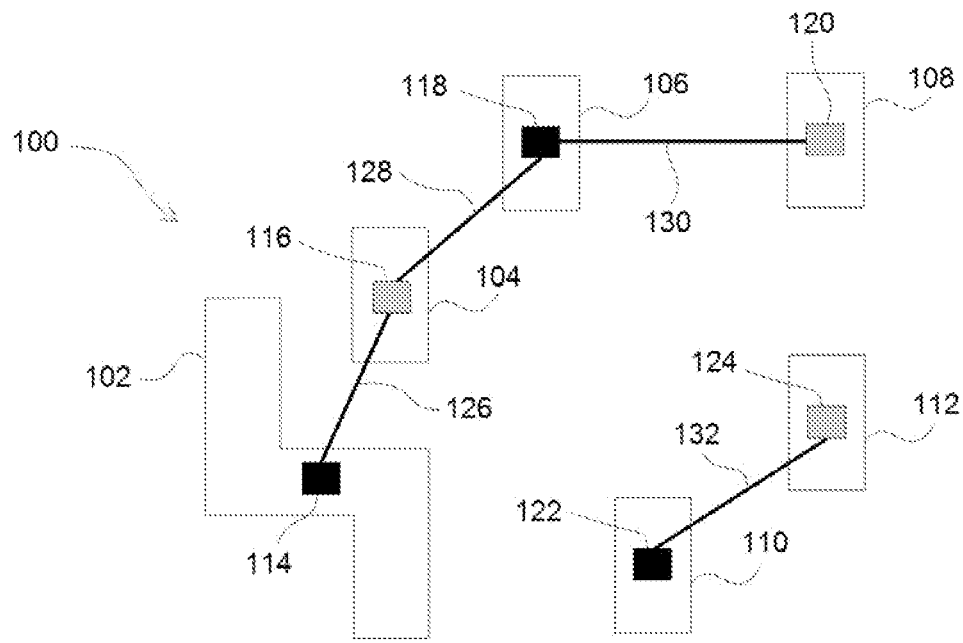

Different coloring results can cause a specific node (pattern) to be treated differently, in various environments. For example, for the solution shown in FIG. 1B, the nodes 116, 120 and 124 are assigned with a second color (e.g., color gray), meaning the circuit patterns 104, 108, and 112 are formed by a second photomask. When the circuit patterns 104, 108, and 112 are formed first in a layer or a region of the layer of an IC, no other circuit patterns are present on the layer or the region of the layer of the IC because the circuit patterns 102, 106 and 110 are yet to be formed by a first photomask. The node 124 of the G0-linked network 2 can "see" the nodes 116 and 120 in the layer or the region of the layer of the IC. Particularly, the node 124 sees the node 120 that is in close proximity to the node 124. In this situation, the node 124 of the G0-linked network 2 in FIG. 1B is referred to as in a "Mask B dense" environment.

Figure 1C:
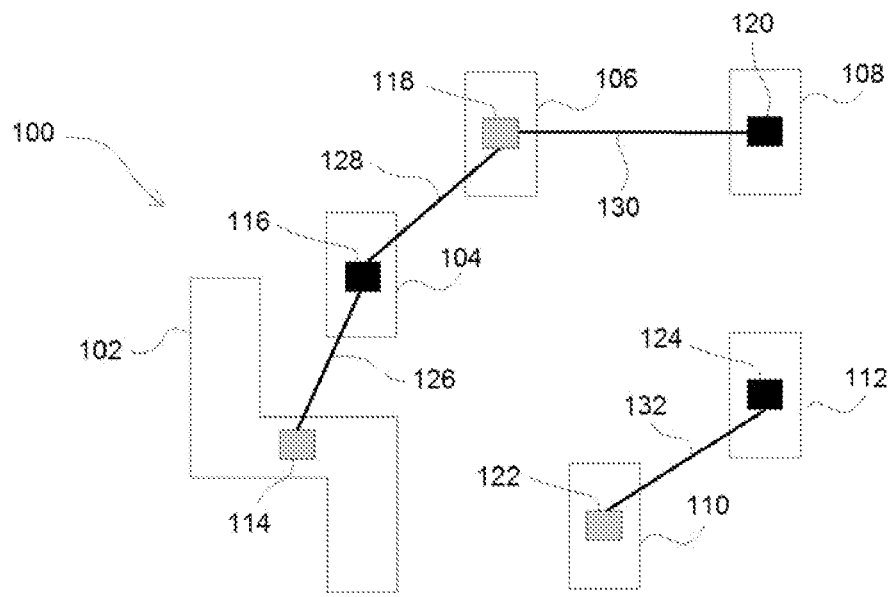

Similarly, for the solution shown in FIG. 1C, the nodes 116, 120 and 124 are assigned with a first color (e.g., color black), meaning the circuit patterns 104, 108, and 112 are formed by a first photomask. When the circuit patterns 104, 108, and 112 are formed first in a layer or a region of the layer of an IC, no other circuit patterns are present on the layer or the region of the layer of the IC because the circuit patterns 102, 106 and 110 are yet to be formed by a second photomask. The node 124 of the G0-linked network 2 can "see" the nodes 116 and 120 in the layer or the region of the layer of the IC. Particularly, the node 124 sees the node 120 that is in close proximity to the node 124. In this situation, the node 124 of the G0-linked network 2 in FIG. 1C is referred to as in a "Mask A dense" environment.

On the other hand, for the solution shown in FIG. 1A, the nodes 114, 118 and 124 are assigned with a first color (e.g., color black), meaning the circuit patterns 102, 106, and 112 are formed by a first photomask. When the circuit patterns 102, 106, and 112 are formed first in a layer or a region of the layer of an IC, no other circuit patterns are present on the layer or the region of the layer of the IC because the circuit patterns 104, 108 and 110 are yet to be formed by a second photomask. For node 124 of the G0-linked network 2, it does not "see" other nodes in the layer or the region of the layer of the IC but the nodes 114 and 118 that are also formed by the first photomask. Particularly, the node 124 does not see the node 120, which would otherwise have been seen if it was in a "Mask A dense" environment. In this situation, the node 124 of the G0-linked network 2 in FIG. 1A is referred to as in a "Mask A isolated" environment.

Figure 1D:
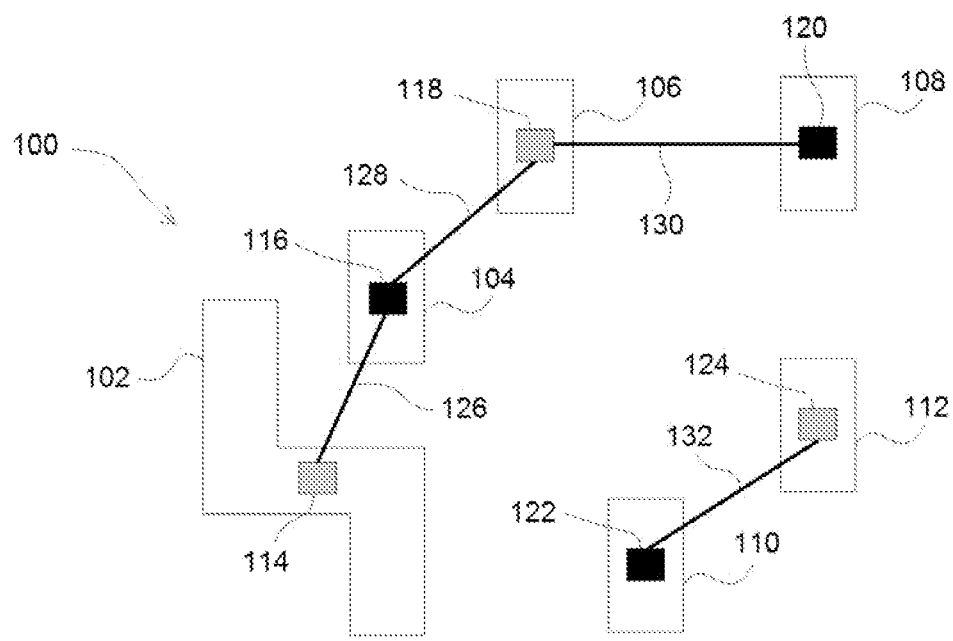

Likewise, for the solution shown in FIG. 1D, the nodes 114, 118 and 124 are assigned with a second color (e.g., color gray), meaning the circuit patterns 102, 106, and 112 are formed by a second photomask. When the circuit patterns 102, 106, and 112 are formed first in a layer or a region of the layer of an IC, no other circuit patterns are present on the layer or the region of the layer of the IC because the circuit patterns 104, 108 and 110 are yet to be formed by a first photomask. For node 124 of the G0-linked network 2, it does not "see" other nodes in the layer or the region of the layer of the IC but the nodes 114 and 118 that are also formed by the second photomask. Particularly, the node 124 does not see the node 120, which would otherwise have been seen if it was in a "Mask B dense" environment. In this situation, the node 124 of the G0-linked network 2 in FIG. 1D is referred to as in a "Mask B isolated" environment.

As can be seen in FIGS. 1A-1D, the node 124 of the G0-linked network 2 could be in four different environments (i.e., "Mask A isolated", "Mask B isolated", "Mask A dense", and "Mask B dense") due to different coloring results created during the decomposition process. Node 122 of the G0-linked network 2 and other nodes of the G0-linked network 1 could also be in isolated and/or dense environments for the same reason. Process conditions for formation of the circuit patterns may vary in different environments. For example, when the node 124 of the G0-linked network 2 is in a "Mask A dense" environment as shown in FIG. 1C, the amount of an etchant used to form the pattern 112 (e.g., a via) may be different from the amount used in the situation if the node 124 of the G0-linked network 2 was in a "Mask A isolated" environment shown in FIG. 1A, because the node 120 is formed by the same photomask as the node 124 and is in close proximity to the node 124 (i.e., node 124 sees node 120). In such a case, the amount of the etchant used in forming the patterns 108 and 112 may be relatively less as compared to the amount used in forming the pattern 112 in a "Mask A isolated" environment (i.e., node 124 does not see node 120), considering both pattern 112 and pattern 108 are simultaneously formed in a close neighborhood. Not only the etchant amount may vary for each node in different environments, the etchant receipt used in forming a specific node may also be changed from time to time because that specific node could be assigned to a different color (different photomask) due to design change or different database adapted by different clients/chip designers.

Different coloring combinations can lead to various changes in the process receipts during lithography and uncertainties in the manufacture of semiconductor devices since every node in each G0-linked network could be in various environments due to inconsistencies in coloring results during the decomposition process. However, the process limitations (e.g., lithography, etching, or CMP etc.) in advanced nodes cannot tolerate unexpected coloring combinations in critical points or hotspots, which may include process weakness regions formed as a result of bridging or shrinkage of the critical dimension that may have great possibility to incur defects. These issues get worse especially when the number of G0-linked networks in the target area increases.

Figure 2A:
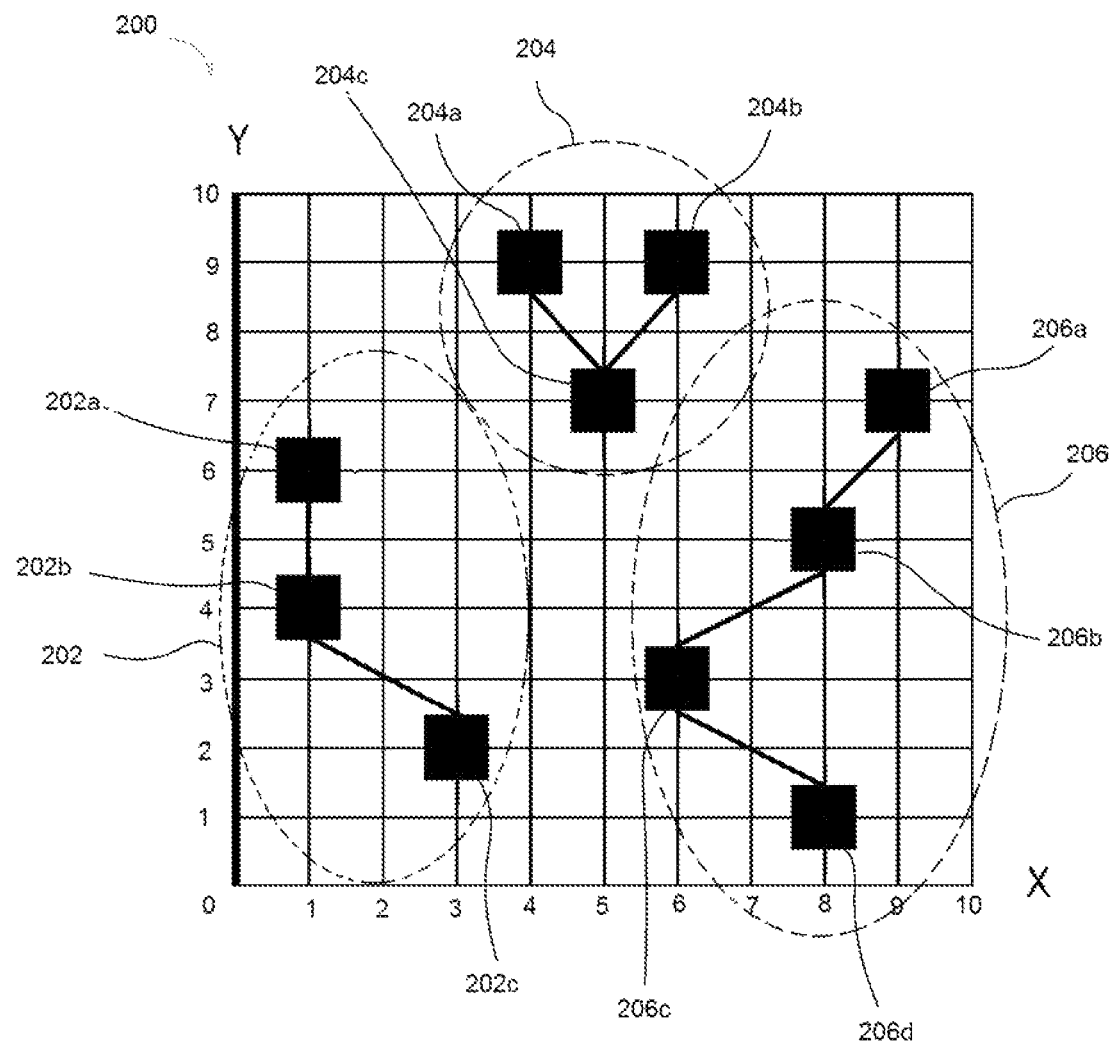
FIGS. 2A and 2B depict a portion of a DPT-compliant layout design before and after the application of a coloring method according to one implementation of the present disclosure.
Figure 2B:
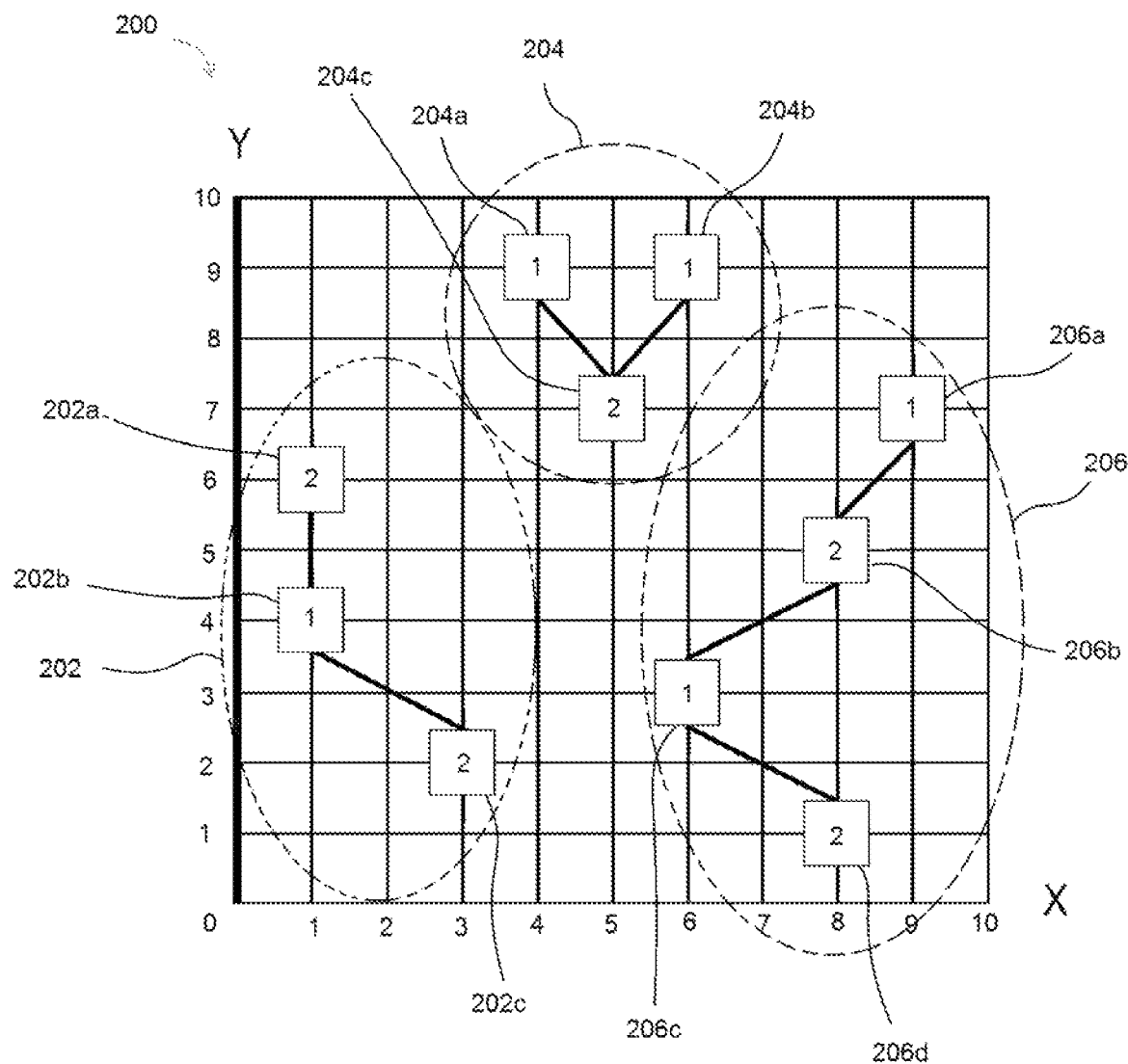

Exemplary coloring methods of the present disclosure can be applied to a DPT-compliant layout (i.e., the circuit patterns in the layout can be separated into two photomask and is thus 2-colorable), to avoid process issues due to inconsistencies in coloring results. FIGS. 2A and 2B depict a portion of a DPT-compliant layout design 200 before and after the application of a coloring method according to one implementation of the present disclosure. In FIG. 2A, three G0-linked networks 202, 204, and 206 ("target networks") in the DPT-compliant layout design 200 have been identified by a software, such as a design rule checker (DRC) software. It is understood that three G0-linked networks are shown here for illustration purposes. The DPT-compliant layout design 200 may have other G0-linked networks. In addition, implementations of the present disclosure are applicable to multiple-patterning technology (MPT)-compliant layout designs.

Each G0-linked network 202, 204, 206 shown in FIG. 2A includes three or more nodes. For example, G0-linked network 202 has nodes 202a, 202b, 202c, G0-linked network 204 has nodes 204a, 204b, 204c, and G0-linked network 206 has nodes 206a, 206b, 206c, 206d. As discussed previously, the nodes are representations of the circuit patterns, which may be interconnect (line layer) patterns in a back end of line (BEOL) interconnect layer, or active device (front end of line) layer patterns. The nodes in each G0-linked network 202, 204, 206 are linked together as they are separated by a distance less than a minimum separation distance (i.e., G0-space) for a given IC technology (e.g., 45 nm, 20 nm, 16 nm, or the like). For 193 nm lithography, the minimum separation distance may be about 70 nm to about 120 nm, for example about 100 nm.

After the G0-linked networks 202, 204, and 206 have been identified, the coloring method is performed to pre-color the node in each G0-linked network. The coloring method may be performed by an EDA layout tool or any suitable automated tool. In one implementation, the coloring method is a coordinate-based coloring method which sorts and pre-colors the node in each G0-linked network 202, 204, 206 by coordinate. For example, the DPT-compliant layout design 200 having all G0-linked networks or G0-linked networks of interest (e.g., G0-linked networks 202, 204, 206) can be presented in an imaginary X-Y coordinate plane in the EDA layout tool. Therefore, the nodes in each G0-linked network are presented in the imaginary X-Y coordinate plane. In one implementation, the node in each G0-linked network that is closest to the Y-axis (i.e., the node having the lowest X coordinate) will be designated with a first color (color 1) by the EDA layout tool. If two or more nodes in the G0-linked network are found to have the same X coordinate, then the node that is closest to the X-axis (i.e., the node having the lowest Y coordinate) will be designated with the first color. In other words, the node in each G0-linked network that has the lowest X coordinate and the lowest Y coordinate will be assigned with the first color.

For instance, in the implementation shown in FIG. 2A, the G0-linked network 202 has three nodes 202a, 202b, 202c. Node 202a has coordinates (x1, y6) and note 202b has coordinates (x1, y4). Although node 202a and node 202b have the same X coordinate, node 202b will be designated with the first color because it is closer to the X axis. Similarly, the G0-linked network 204 has three nodes 204a, 204b, 204c, and the node 204a, with coordinates (x4, y9), will be designated with the first color because it is closest to the Y-axis than nodes 204b (x6, y9) and nodes 204c (x5, y7). The G0-linked network 206 has four nodes 206a, 206b, 206c, 206d, and the node 206c, with coordinates (x6, y3), will be designated with the first color because it is the one closest to the Y-axis than nodes 206a (x9, y7), node 206b (x8, y5), and node 206d (x8, y1).

After the first node in each G0-linked network has been designated with the first color, the EDA layout tool will perform a decomposition algorithm to assign first and second colors to the rest of the nodes in each G0-linked network in an alternating manner so that any two immediately adjacent linked nodes in each G0-linked network are designated with different colors. For example, in the implementation shown in FIG. 2A, the node 202b of the G0-linked network 202 has been designated with the first color, so the nodes 202a and 202c will be designated with a second color (color 2), as shown in FIG. 2B. Similarly, the node 204a of the G0-linked network 204 has been designated with the first color, so the node 204c will be designated with the second color while the node 204b will be designated with the first color, as shown in FIG. 2B. Likewise, the node 206c of the G0-linked network 206 has been designated with the first color, so the nodes 206b, and 206d will be designated with the second color and the node 206a will be designated with the first color, as shown in FIG. 2B.

Once all the nodes in each G0-linked network have been colored, a photomask assignment procedure is performed. For example, nodes that are designated with color 1 will be assigned to a first photomask while nodes that are designated with color 2 will be assigned to a second photomask, or vice versa.

It should be noted that while coloring methods discussed herein designating color to the node in each G0-linked network based on the "lowest X coordinate first then lowest Y coordinate" rule (i.e., the node having lowest X coordinate and lowest Y coordinate), the concept of the present disclosure is equally applicable to the "lowest X coordinate first then largest Y coordinate" rule (i.e., the node having lowest X coordinate and largest Y coordinate), the "largest X coordinate first then lowest Y coordinate" rule (i.e., the node having largest X coordinate and lowest Y coordinate), or "largest X coordinate first then largest Y coordinate" rule (i.e., the node having largest X coordinate and largest Y coordinate). Other rules may also be used as long as a consistent rule is applied to all G0-linked networks in a DPT-compliant layout design. In addition, while the term "color" is discussed in this disclosure, it is contemplated that color can be replaced by any suitable distinctive features such as shapes, numbers, icons, symbols, or the like.

For those non DPT-compliant layout designs, e.g., the total number of G0-spaces violating the minimum spacing requirements is an odd number (i.e., an odd-cycle loop), the layout design will need to be changed before the coloring method can be applied. In such a case, the layout design needs to be changed so that G0-spaces form an even-cycle loop, meaning the circuit patterns can be separated into two photomasks and is 2-colorable. A loop is where the G0-spaces among nodes (or polygons) form a cyclic sequence.

Figure 3:
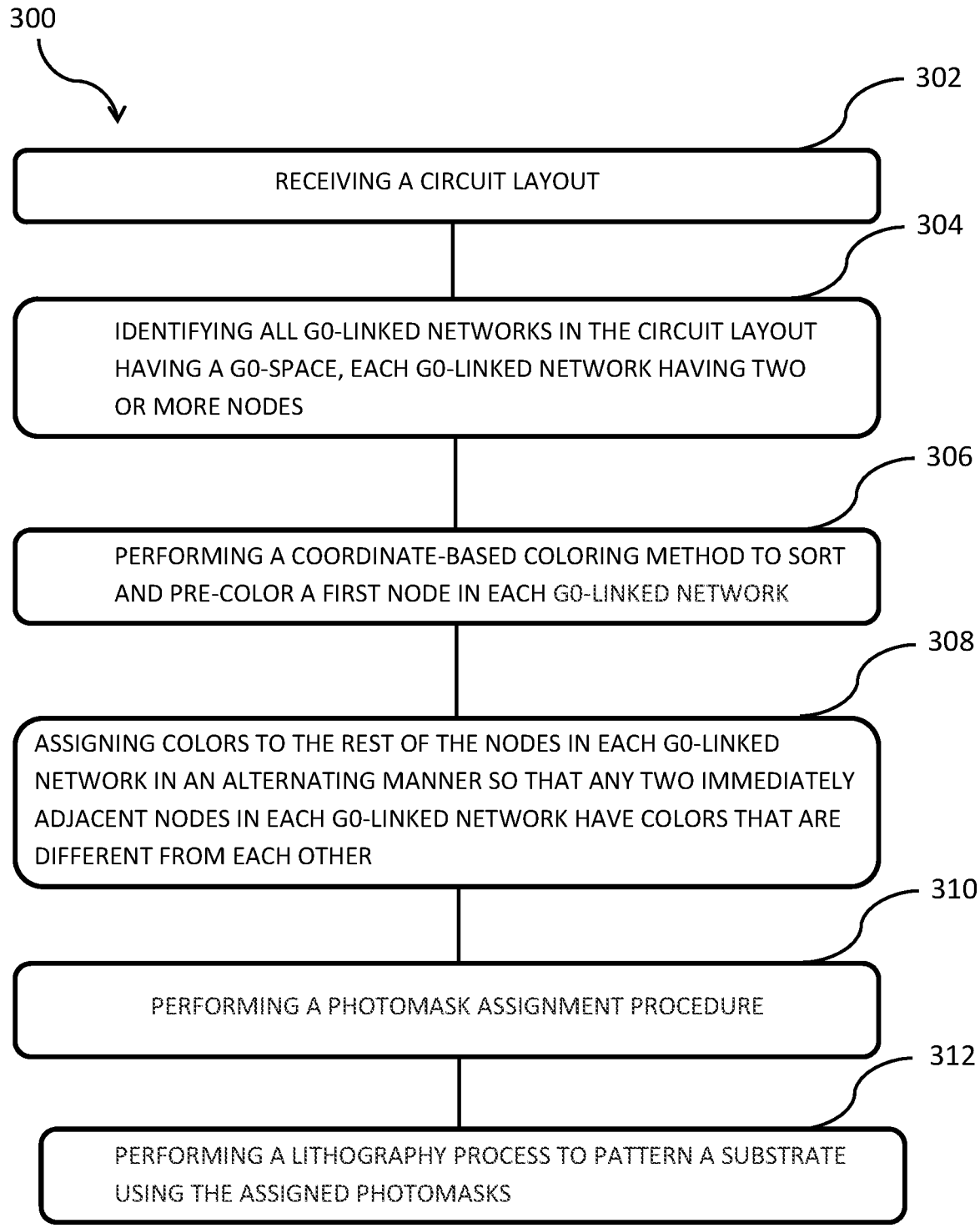
FIG. 3 depicts a flowchart illustrating exemplary coloring method according to implementations of the present disclosure.

FIG. 3 depicts a flowchart illustrating exemplary coloring method 300 according to implementations of the present disclosure. FIGS. 4A-4D depict a portion of a DPT-compliant circuit layout 400 for an integrated chip 1 at different stages according to the flowchart of FIG. 3. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially if not entirely.

Figure 4A:
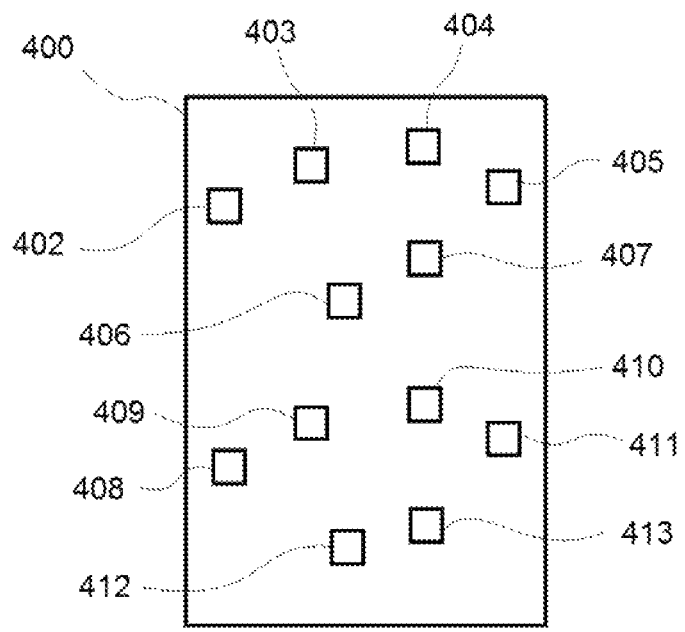
FIGS. 4A-4D depict a portion of a DPT-compliant circuit layout for an integrated chip 1 at different stages according to the flowchart of FIG. 3.

The coloring method 300 starts at operation 302 where a circuit layout, such as the circuit layout 400 shown in FIG. 4A, is received. The initial circuit layout 400 may be generated by a place and route tool. The circuit layout can be in computer aided design format (e.g., GDSII), chip design, or retrieved from a design database. The circuit layout 400 has a plurality of nodes 402-413 representing the circuit patterns. In some implementations, the nodes 402-413 represent the circuit patterns in a single layer of the IC. The nodes 402-413 can be in any form of polygons. Circuit patterns can be interconnect (line layer) patterns in a back end of line (BEOL) interconnect layer, or active device (front end of line) layer patterns. In one implementation, the circuit layout 400 may include all of the circuit patterns on a layer of an IC. In one implementation, the circuit layout may include a subset of the circuit patterns within a region of the layer of the IC.

Figure 4B:
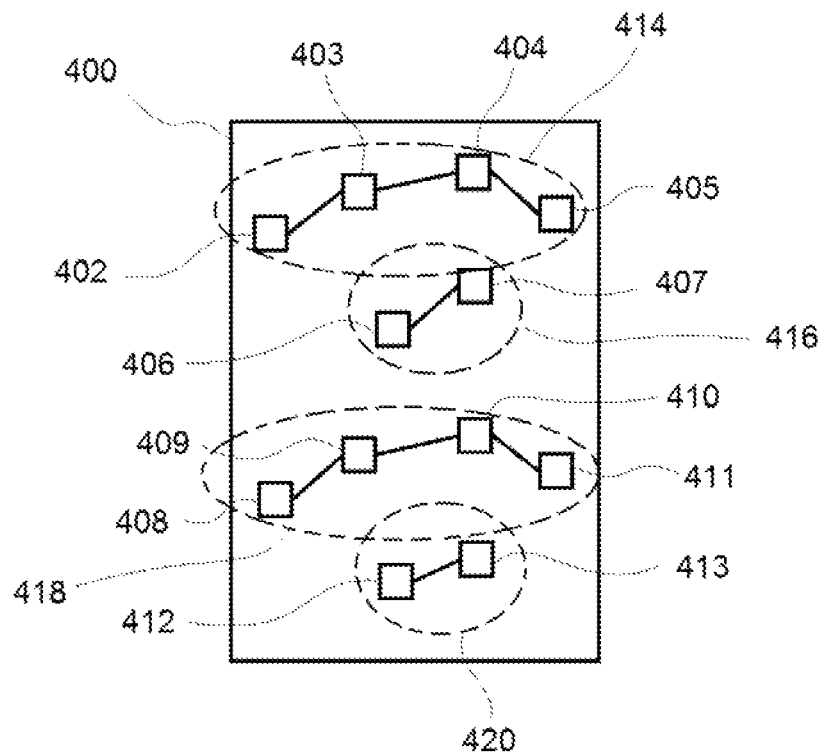

At operation 304, the circuit layout 400 is checked to identify all G0-linked networks ("target networks") having a G0-space according to design rules, for example a spacing rule. A design rule checker (DRC) software or any suitable software may be used to systematically check design rules to show all G0-linked networks or G0-spaces in the circuit layout 400. As discussed before, G0-space refers to nodes being separated by a distance less than a minimum separation distance for a given IC technology (e.g., 45 nm, 20 nm, 16 nm, or the like). For 193 nm lithography, the minimum separation distance may be about 70 nm to about 120 nm, for example about 100 nm. FIG. 4B shows four G0-linked networks 414, 416, 418, 420 have been identified.

Figure 4C:
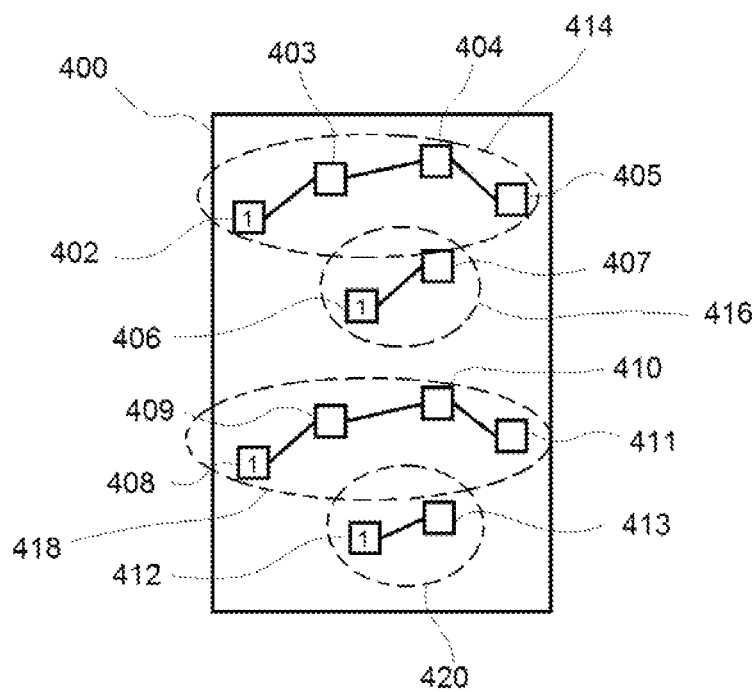

At operation 306, each G0-linked networks 414, 416, 418, 420 is subjected to a coordinate-based coloring method as discussed above with respect to FIGS. 2A and 2B. As discussed previously, the coordinate-based coloring method is performed by an EDA layout tool or any suitable automated tool to sort and pre-color the node in each G0-linked network 414, 416, 418, 420 so that the node in each G0-linked network that is closest to the Y-axis (i.e., the node having the lowest X coordinate) is designated with a first color (color 1). If two or more nodes in the G0-linked network have the same X coordinate, then the node of that two or more nodes that is closest to the X-axis (i.e., the node having the lowest Y coordinate) will be designated with the first color. In other words, the node in each G0-linked network that has the lowest X coordinate and the lowest Y coordinate will be assigned with the first color. FIG. 4C shows each G0-linked network 414, 416, 418, 420 have been sorted and pre-colored using the coordinate-based coloring method. In the implementation of FIG. 4C, the node 402 of the G0-linked network 414, the node 406 of the G0-linked network 416, the node 408 of the G0-linked network 418 and the node 412 of the G0-linked network 420 have been designated with a first color (color 1).

Figure 4D:
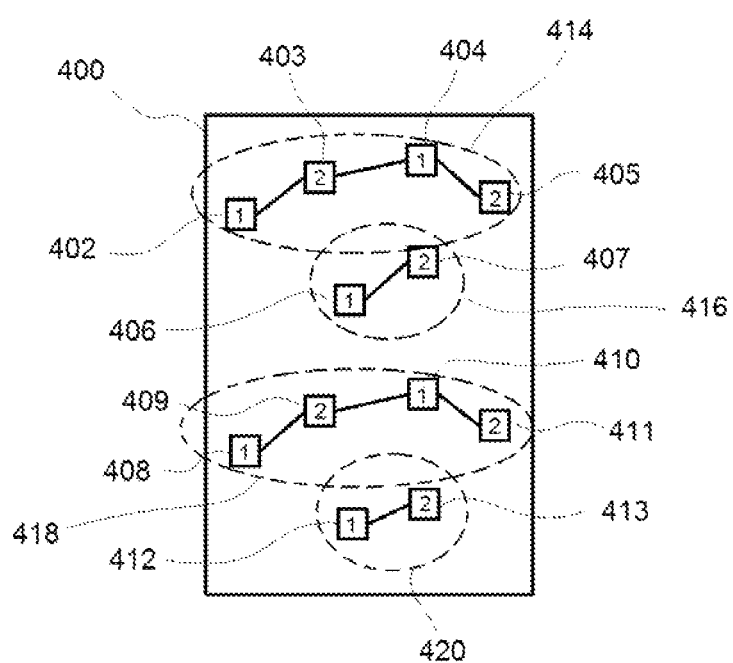

At operation 308, after the node in each G0-linked network 414, 416, 418, 420 have been pre-colored, a decomposition algorithm is performed by the EDA tool to assign colors to the rest of the nodes in each G0-linked network 414, 416, 418, 420 in an alternating manner so that any two immediately adjacent nodes in each G0-linked network 414, 416, 418, 420 have colors that are different from each other. FIG. 4D shows the color designation of the G0-linked network 414, 416, 418, 420 after the decomposition process where the nodes 403 and 405 of the G0-linked network 414 are designated with a second color (color 2) and the node 404 is designated with the first color; the node 407 of the G0-linked network 416 is designated with the second color; the nodes 409 and 411 of the G0-linked network 418 are designated with the second color and the node 410 is designated with the first color; and the node 413 of the G0-linked network 420 is designated with the second color.

At operation 310, once all the nodes in each G0-linked network have been colored, a photomask assignment procedure is performed. For example, nodes (e.g., nodes 402, 404, 406, 408, 410, 412) in each G0-linked networks 414, 416, 418, 420 that are designated with color 1 will be assigned to a first photomask while nodes (e.g., nodes 403, 405, 407, 409, 411, 413) that are designated with color 2 will be assigned to a second photomask, or vice versa. The photomask assignment data is then outputted to a readable storage medium for use by a lithography process.

At operation 312, once the photomask assignment procedure is done, a lithography process is performed to pattern a semiconductor substrate using the assigned photomasks.

Figure 5A:
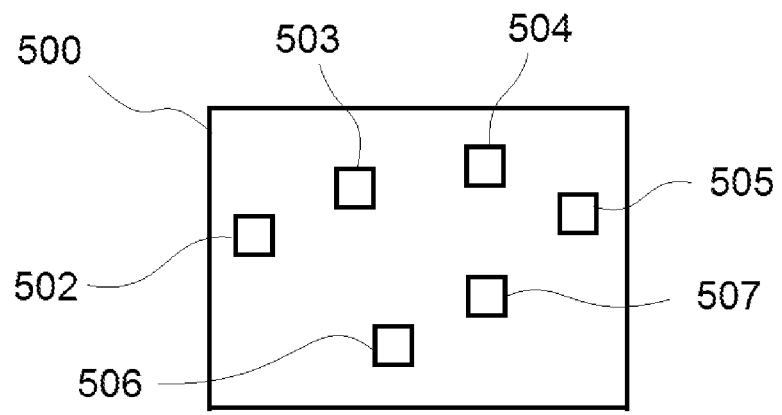
FIGS. 5A-5D depict a portion of a DPT-compliant circuit layout for an integrated chip 2 at different stages according to the flowchart of FIG. 3.
Figure 5B:
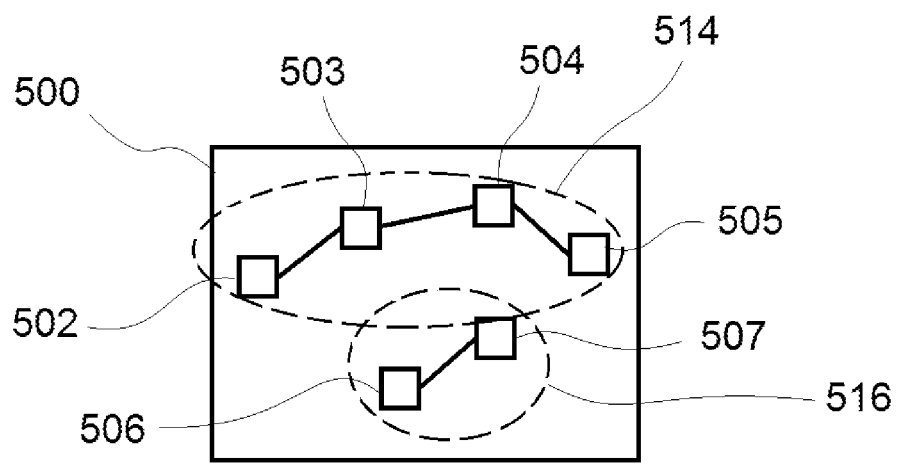
Figure 5C:
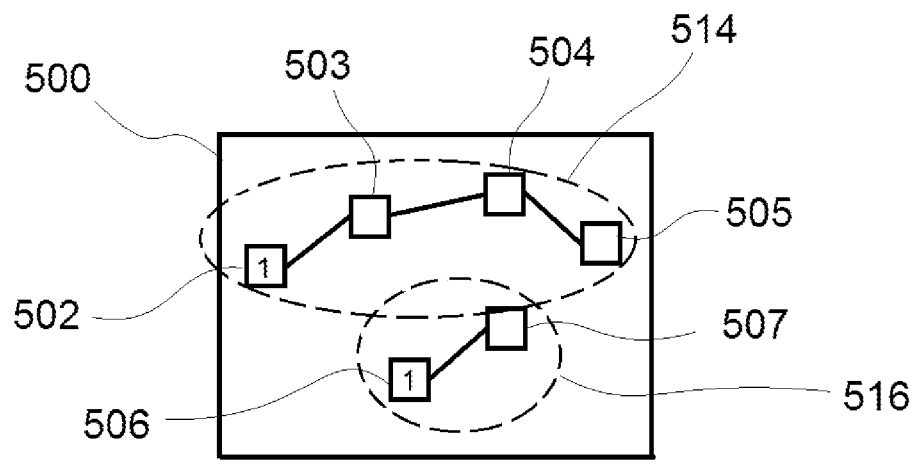

FIGS. 5A-5D depict a portion of a DPT-compliant circuit layout 500 for an integrated chip 2 at different stages according to the flowchart of FIG. 3. Similarly to FIGS. 4A-4D, the circuit layout 500 as received has a plurality of nodes 502-507 representing the circuit patterns, as shown in FIG. 5A. The nodes 502-507 have substantially identical arrangements to the nodes 402-413 of FIG. 4A. The circuit layout 500 is systematically checked to identify all G0-linked networks having a G0-space according to design rules, for example a spacing rule. FIG. 5B shows two G0-linked networks 514 and 516 have been identified. Each G0-linked networks 514, 516 is then subjected to a coordinate-based coloring method as discussed above with respect to FIGS. 2A and 2B. FIG. 5C shows each G0-linked network 514, 516 have been sorted and pre-colored using the coordinate-based coloring method. In the implementation of FIG. 5C, the node 502 of the G0-linked network 514 and the node 506 of the G0-linked network 516 have been designated with a first color (color 1).

Figure 5D:
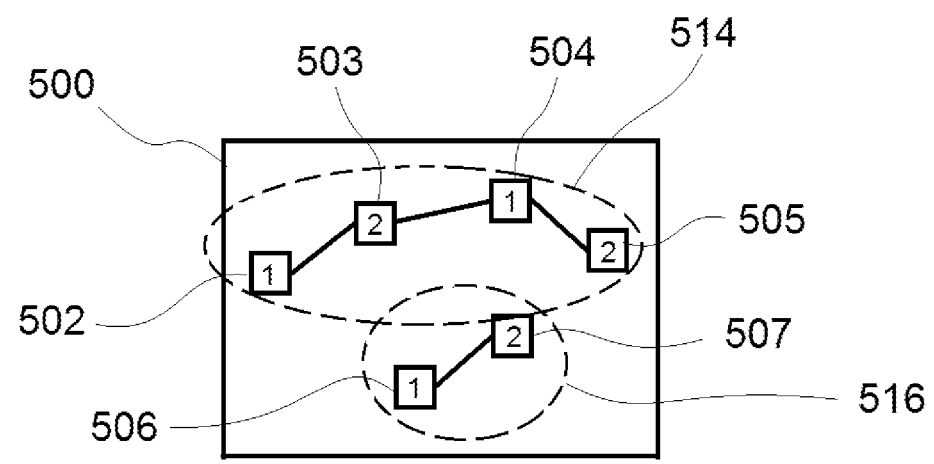

After the node in each G0-linked network 514, 516 have been pre-colored, a decomposition algorithm is performed to assign colors to the rest of the nodes in each G0-linked network 514, 516 in an alternating manner so that any two immediately adjacent linked nodes in each G0-linked network 514, 516 are designated with colors that are different from each other. FIG. 5D shows the color designation of the G0-linked network 514, 516 after the decomposition process where the nodes 503 and 505 of the G0-linked network 514 are designated with a second color (color 2) and the node 504 is designated with the first color, and the node 507 of the G0-linked network 516 is designated with the second color.

Once all the nodes in each G0-linked network 514, 516 have been colored, a photomask assignment procedure is performed. For example, nodes (e.g., nodes 502, 504, 506) in each G0-linked networks 514, 516 that are designated with color 1 will be assigned to a first photomask while nodes (e.g., nodes 503, 505, 507) designated with color 2 will be assigned to a second photomask, or vice versa.

The coloring results shown in FIGS. 4D and 5D prove that identical or similar G0-linked networks will have the same coloring results/sequence even if they are from different circuit layouts 400, 500 and are designed for different integrated chips. In other words, all G0-linked networks in one or more DPT-compliant layout designs will have consistent coloring results/combinations no matter what database is adapted by clients/chip designers, or how many design changes have been made or are going to be made in the layout design. As a result, uncertainties in the manufacture of semiconductor devices can be avoided regardless of whether nodes in G0-linked network are in dense or isolated environment.

In addition, since coloring results of each G0-linked network in a DPT-compliant layout design is predictable and consistent from location to location or from chip to chip, such coloring uniqueness can be used to construct a coloring fingerprint database for instant assignment of photomasks for recurring G0-linked networks. For example, the unique arrangement of the G0-linked networks 414, 416, 418, 420 shown in FIG. 4D can be stored as fingerprint regions in a non-transitory machine readable storage medium for use in a photomask assignment process. An EDA tool, a pattern-matching tool, or any suitable pattern-recognition tool can then be used to search/analyze shapes in any IC layout design. If the EDA tool or the pattern-matching tool finds G0-linked networks having an arrangement identical or substantially similar to the G0-linked networks 414, 416, 418, 420 stored in the machine readable storage medium, a unique coloring combination photomask assignment) associated with the G0-linked networks 414, 416, 418, 420 will automatically or manually be assigned to that new G0-linked networks. In this way, the pattern which matches the fingerprint regions will be assigned with the same coloring results as the G0-linked networks in the fingerprint regions.

Figure 6:
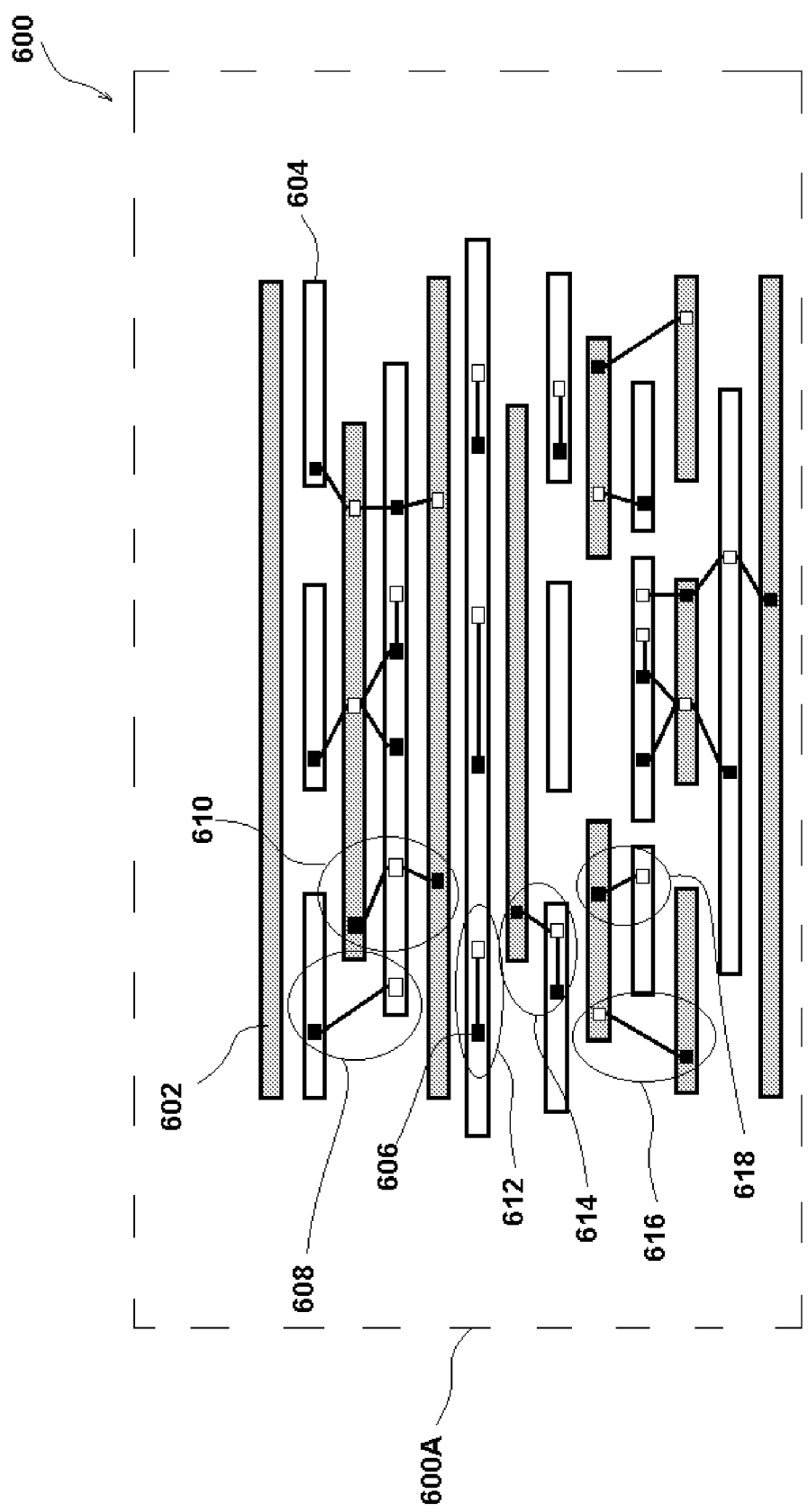
FIG. 6 depicts a region of an exemplary circuit layout showing a plurality of G0-linked networks that have been colored according to coloring methods of the present disclosure.

FIG. 6 depicts a region 600A of an exemplary circuit layout 600 showing a plurality of G0-linked networks that have been colored according to the exemplary coloring methods of the present disclosure. The region 600A of the circuit layout 600 has a first set of lines (collectively shown as 602) representing metal lines in various lengths and a second set of lines (collectively shown as 604) representing metal lines in various lengths. The first set of lines 602 have been assigned to a first photomask (represented by color gray) and the second set of lines 604 have been assigned to a second photomask (represented by color white). The region 600A of the circuit layout 600 also has a plurality of squares (collectively shown as 606) representing vias. The metal lines may be disposed at a different layer above and/or underneath the vias in an IC. The squares 606 having G0-spaces are linked and identified as G0-linked networks, of which only 608, 610, 612, 614, 616, and 618 are shown for illustration purposes.

Figure 7A:
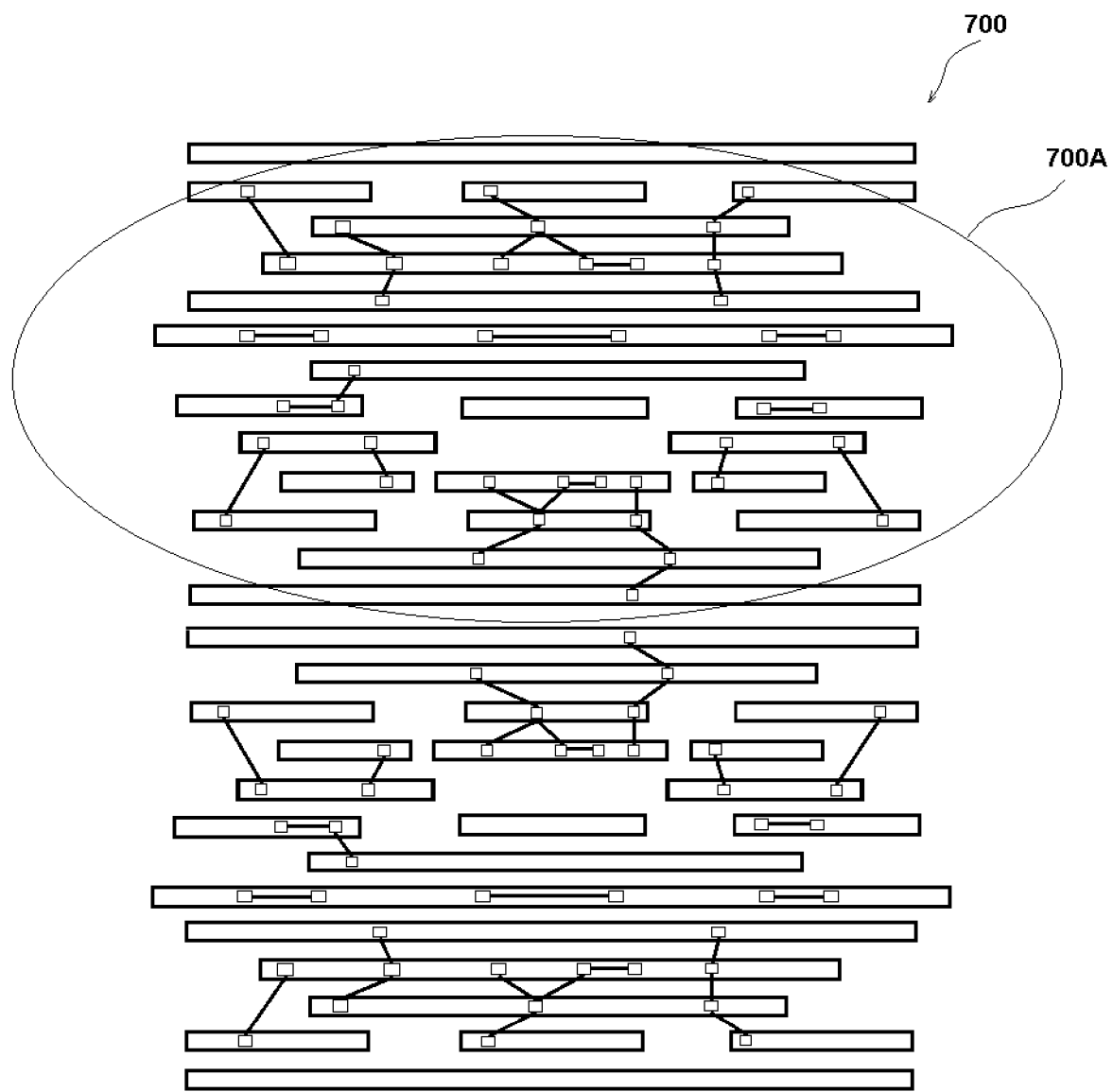
FIG. 7A depicts a region of a circuit layout having G0-linked network matched the region of FIG. 6.
Figure 7B:
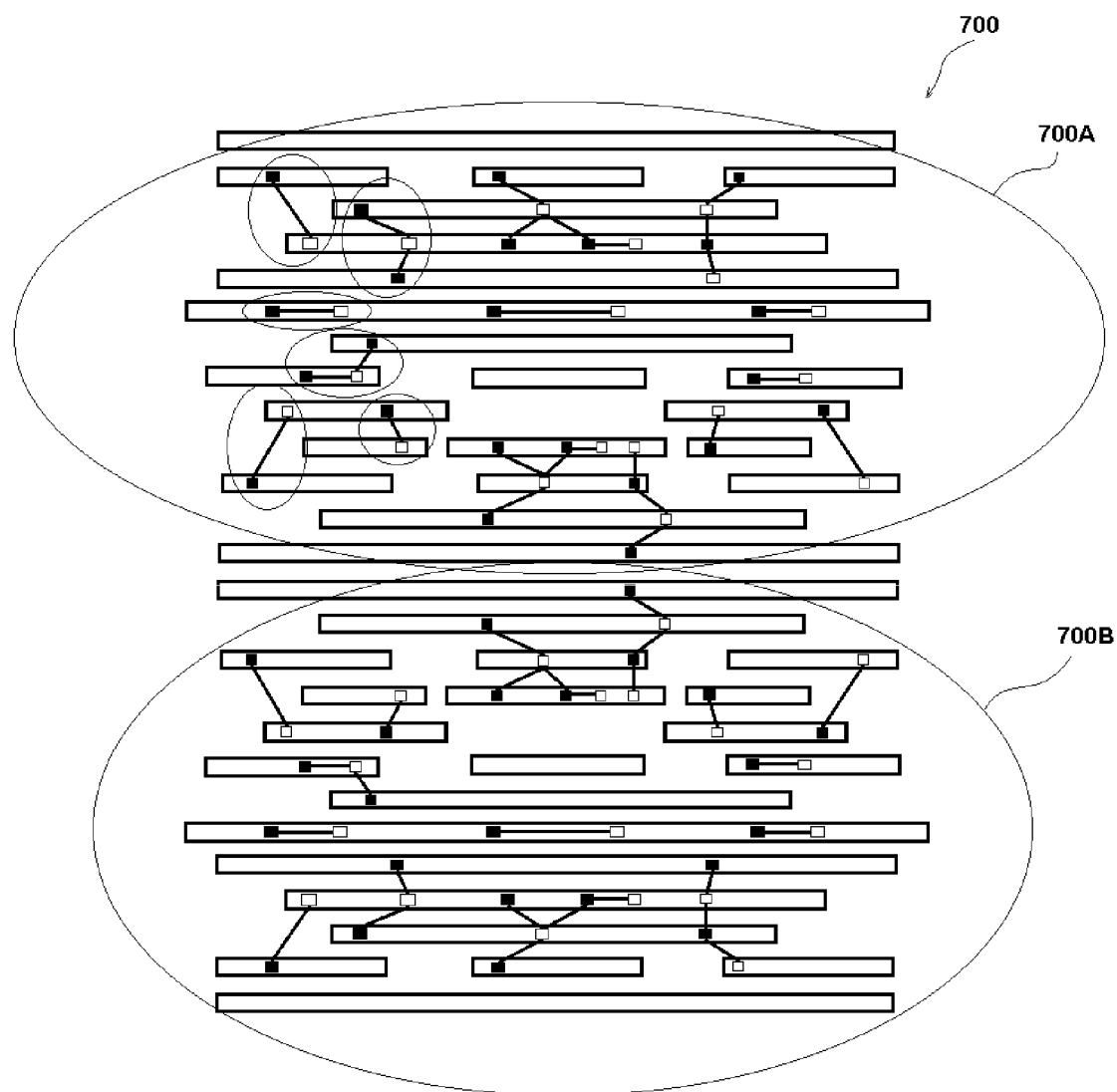
FIG. 7B depicts the G0-linked networks have been colored after the photomask assignment.

As can be seen, each of the G0-linked networks have been colored (i.e., assigned to different photomasks) using the coloring methods discussed above with respect to FIGS. 2A-5D. In one implementation, one or more G0-linked networks and their unique coloring combinations shown in the region 600A may be stored in the machine readable storage medium and used as a fingerprint to identify/assign a unique coloring combination to identical/similar G0-linked networks appeared in a different circuit layout or different regions of the same circuit layout. For example, the EDA tool may find the region 700A of a circuit layout 700 (FIG. 7A) having identical G0-linked networks matched the region 600A. Therefore, the EDA tool can instantly assign coloring combinations associated with the region 600A to the G0-linked networks appearing in the region 700A so that the G0-linked networks in the region 700A have identical coloring combinations to the region 600A. The EDA tool may continue to apply the coloring methods to the rest of G0-linked networks in the region 700B of the circuit layout 700. FIG. 7B depicts the G0-linked networks have been colored after the photomask assignment. The coloring fingerprint database therefore allows instant and consistent coloring results in recurring G0-linked networks for DPT-compliant layout designs.

Figure 8:
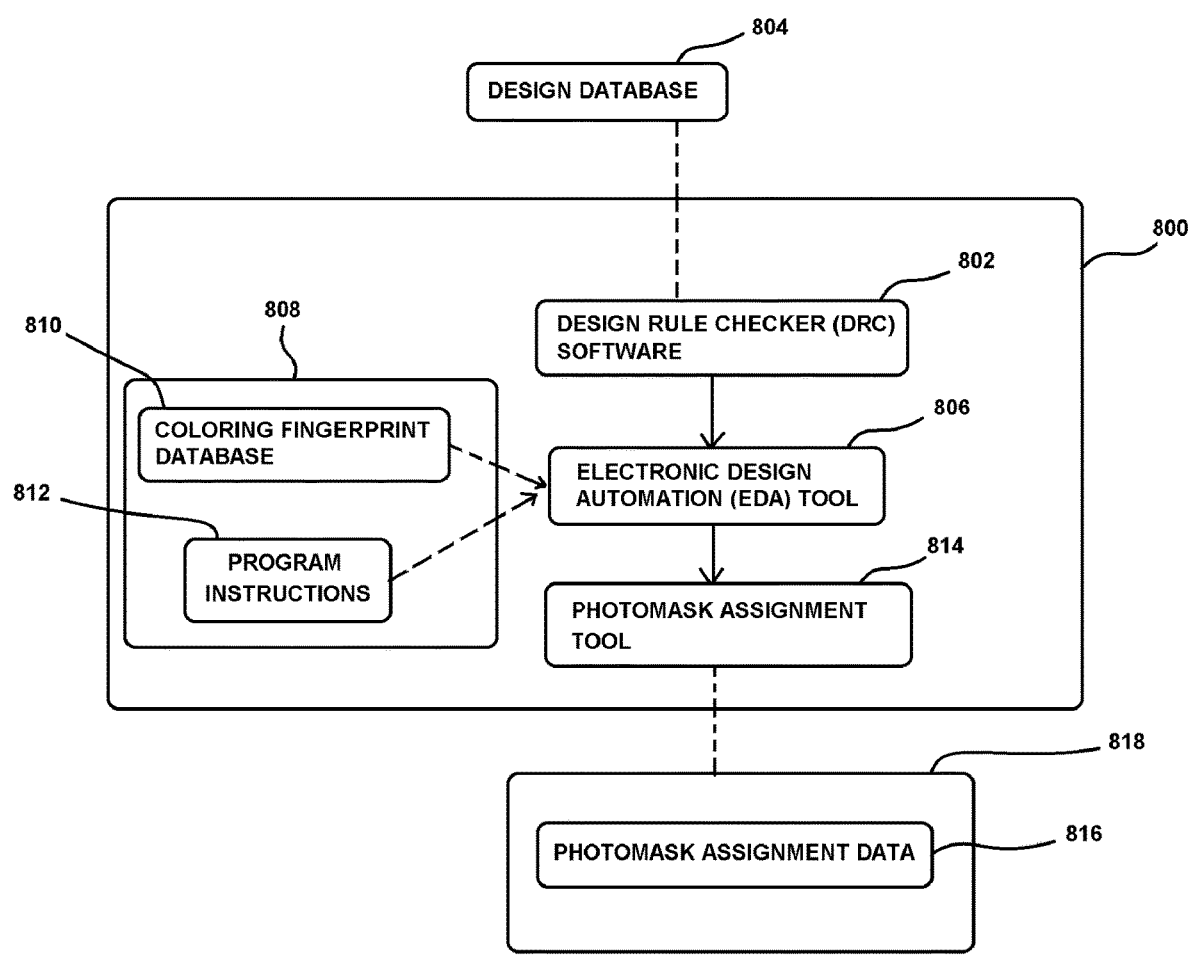
FIG. 8 depicts a system that may be used to practice various implementations of the present disclosure.

FIG. 8 depicts a system 800 that may be used to practice various implementations of the present disclosure. The system 800 includes a design rule checker (DRC) 802 that can check a circuit layout in computer aided design format from a design database 804. The DRC 802 identifies all G0-linked networks having a G0-space according to design rules, for example a spacing rule, as described at operation 304 of FIG. 3. The system 800 also includes an electronic design automation (EDA) tool 806 and a storage media 808 that is provided to store input data used by the EDA tool 806. The EDA tool 806 receives data from DRC 802, such as data showing all G0-linked networks or G0-spaces in the circuit layout.

The storage medium 808 may be a non-transient computer readable storage medium such as dynamic random access memory (RAM), SDRAM, a read only memory (ROM), EEPROM, a hard disk drive (HDD), an optical disk drive (CD-ROM, DVD-ROM or BD-ROM), or a flash memory, or the like. The input data may include data from a coloring fingerprint database 810 that stores one or more unique coloring combination (i.e., photomask assignment) associated with the G0-linked networks, as described above with respect to FIGS. 6, 7A and 7B. The input data may also include data from program instructions 812 that have design information or design rules for executing various instructions. For example, the program instructions may include instructions for changing odd-cycle loops found in non DPT-compliant layout designs (e.g., the total number of G0-spaces violating the minimum spacing requirements is an odd number) to even-cycle loops.

The EDA tool 806 may be a special purpose computer used to perform a coordinate-based coloring method and decomposition process as discussed above with respect to FIGS. 2A, 2B and 3 on G0-linked networks identified by the DRC 802. The system 800 further includes a photomask assignment tool 814 for assigning photomasks to colored G0-linked networks. The photomask assignment tool 814 outputs the photomask assignment data 816 to a non-transitory machine readable storage medium 818 for use by a lithography process, as discussed at operation 310 of FIG. 3.

Implementations of the present disclosure provide novel coloring methods that sort and pre-color nodes of G0-linked networks in a DPT-compliant layout design by coordinate. By designating color to the node in each G0-linked network based on "lowest X coordinate first then lowest Y coordinate" rule, an EDA layout tool or any suitable automated tool is guaranteed to generate consistent coloring combinations for any G0-linked networks in DPT-compliant layout designs even if they are located at different areas of the layout design or separated by other dissimilar G0-linked networks. Particularly, all G0-linked networks in a DPT-compliant layout design will have unique and consistent coloring results no matter what database is adapted by clients/chip designers or how many design changes have been made, or are going to be made in the layout design. Unique coloring combinations will remain consistent regardless of which area or which layer(s) in the IC is analyzed. Furthermore, G0-linked networks having a unique coloring combination can be used to construct a coloring fingerprint database for instant assignment of photomasks for recurring G0-linked networks. The inventive coloring method and coloring fingerprint database can minimize any process issues that could otherwise occur due to inconsistencies in coloring results during the decomposition process. As a result, any uncertainty in the manufacture of semiconductor devices is avoided.

In one embodiment, a method includes identifying target networks in a circuit layout, each target network having two or more linked nodes representing circuit patterns, and each target network being presented in an imaginary X-Y coordinate plane, assigning a first feature to a first node in each target network, the first node is determined using a coordinate-based method, and assigning the first feature and a second feature to remaining nodes in each target network in an alternating manner so that any two immediately adjacent linked nodes in each target network have different features.

In another embodiment, a method includes receiving a multiple-patterning technology (MPT)-compliant circuit layout having a plurality of nodes, each node representing a circuit pattern, identifying nodes being separated by a distance less than a minimum separation distance as target networks, the target networks being presented in an imaginary X-Y coordinate plane, using a coordinate-based method to identify a first node in each target network, assigning a first color to the first node in each target network, and assigning the first color and a second color to remaining nodes in the target networks in an alternating manner so that any two immediately adjacent nodes in each target network have different colors.

In yet another embodiment, a system includes a design rule checker configured to check a circuit layout and identify G0-linked networks in the circuit layout having a G0-space, each G0-linked network having two or more linked nodes representing circuit patterns, and a computer configured to receive data from the design rule checker to identify a first node in each G0-linked network using a coordinate-based coloring method, each G0-linked network being presented in an imaginary X-Y coordinate plane in the computer, assign a first color to the identified first node in each G0-linked network, and assign the first color and a second color to remaining nodes in each G0-linked network in an alternating manner so that any two immediately adjacent linked nodes in each G0-linked network have different colors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask data generation apparatus, comprising:
a non-transitory computer-readable memory storing a program; and
a processor operatively coupled with the memory,
wherein the program, when executed by the processor, causes the processor to perform:
receiving a multiple-patterning technology (MPT)-compliant circuit layout having a plurality of nodes, each node representing a circuit pattern;
assigning a number to an analysis counter;
identifying nodes being separated by a distance less than a minimum separation distance as target networks, the target networks being presented in an imaginary X-Y coordinate plane;
identifying a first node in each target network using a coordinate-based method;
assigning a first feature to the first node in each target network;
assigning the first feature and a second feature to remaining nodes in the target networks in an alternating manner so that any two immediately adjacent nodes in the target network have different features;
updating the analysis counter; and
analyzing the MPT-compliant circuit layout based on the analysis counter.

2. The mask data generation apparatus of claim 1, wherein the minimum separation distance is about 70 nm to about 120 nm.

3. The mask data generation apparatus of claim 1, wherein the first node has a lowest X coordinate and a lowest Y coordinate.

4. The mask data generation apparatus of claim 1, wherein the first node has a lowest X coordinate and a largest Y coordinate.

5. The mask data generation apparatus of claim 1, wherein the first node has a largest X coordinate and a lowest Y coordinate.

6. The mask data generation apparatus of claim 1, wherein the first node has a largest X coordinate and a largest Y coordinate.

7. The mask data generation apparatus of claim 1, wherein the program, when executed by the processor, further causes the processor to perform:
storing one or more target networks having a unique coloring combination in a storage medium;
identifying networks in a different circuit layout or different regions of the same circuit layout having an arrangement of nodes identical or similar to the stored target networks; and
assigning the unique coloring combination to the identified networks.

8. The mask data generation apparatus of claim 1, wherein the first feature comprises a first color, and the second feature comprises a second color.

9. The mask data generation apparatus of claim 1, wherein the first feature comprises a first shape, and the second feature comprises a second shape.

10. The mask data generation apparatus of claim 1, wherein the first feature comprises a first number, and the second feature comprises a second number.

11. The mask data generation apparatus of claim 1, wherein the first feature comprises a first icon, and the second feature comprises a second icon.

12. The mask data generation apparatus of claim 1, wherein the first feature comprises a first symbol, and the second feature comprises a second symbol.

13. A mask data generation apparatus, comprising:
a non-transitory computer-readable memory storing a program; and
a processor operatively coupled with the memory,
wherein the program, when executed by the processor, causes the processor to perform:
receiving a multiple-patterning technology (MPT)-compliant circuit layout having a plurality of nodes, each node representing a circuit pattern;
identifying nodes being separated by a distance less than a minimum separation distance as target networks, the target networks being presented in an imaginary X-Y coordinate plane;
identifying a first node in each target network using a coordinate-based method;
assigning a first feature to the first node in each target network; and
assigning the first feature and a second feature to remaining nodes in the target networks in an alternating manner so that any two immediately adjacent nodes in the target network have different features.

14. The mask data generation apparatus of claim 13, wherein the minimum separation distance is about 70 nm to about 120 nm.

15. The mask data generation apparatus of claim 13, wherein the first node has a lowest X coordinate and a lowest Y coordinate.

16. The mask data generation apparatus of claim 13, wherein the first node has a lowest X coordinate and a largest Y coordinate.

17. The mask data generation apparatus of claim 13, wherein the first node has a largest X coordinate and a lowest Y coordinate.

18. The mask data generation apparatus of claim 13, wherein the first node has a largest X coordinate and a largest Y coordinate.

19. The mask data generation apparatus of claim 13, wherein the first and second features are selected from the group consisting of colors, shapes, numbers, icons, and symbols.

20. A mask data generation apparatus, comprising:
a non-transitory computer-readable memory storing a program and a design rule checker; and
a processor operatively coupled with the memory,
wherein the program, when executed by the processor, causes the processor to receive data from the design rule checker to:
(i) assign a number to an analysis counter;
(ii) identify a first node in a G0-linked network using a coordinate-based method, the G0-linked network being presented in an imaginary X-Y coordinate plane in the computer;

(iii) assign a first feature to the identified first node in the G0-linked network; and
(iv) assign the first feature and a second feature to remaining nodes in the G0-linked network in an alternating manner,
(v) update the analysis counter until any two immediately adjacent linked nodes in a target network have different features, and analyze the design rule checker based on the analysis counter.

* * * * *